(12) United States Patent
Oh et al.

(10) Patent No.: US 11,393,891 B2
(45) Date of Patent: Jul. 19, 2022

(54) DISPLAY DEVICE HAVING REDUCED NON-DISPLAY AREA

(71) Applicant: Samsung Display Co., Ltd., Yongin-si (KR)

(72) Inventors: Joonho Oh, Daejeon (KR); Seungjae Kang, Asan-si (KR); Myung-Seok Kwon, Namyangju-si (KR); Yun-Tae Kim, Seoul (KR); Jin-Ki Kim, Asan-si (KR); Hasook Kim, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/782,277

(22) Filed: Feb. 5, 2020

(65) Prior Publication Data

US 2020/0258971 A1 Aug. 13, 2020

(30) Foreign Application Priority Data

Feb. 8, 2019 (KR) .................... 10-2019-0014687

(51) Int. Cl.
| | |
|---|---|
| *H01L 27/32* | (2006.01) |
| *G09G 3/36* | (2006.01) |
| *G09G 3/3225* | (2016.01) |
| *G02F 1/1362* | (2006.01) |

(52) U.S. Cl.
CPC .... *H01L 27/3276* (2013.01); *G02F 1/136286* (2013.01); *G09G 3/3225* (2013.01); *G09G 3/3648* (2013.01)

(58) Field of Classification Search
CPC .......... H01L 27/3276; G02F 1/136286; G09G 3/3225; G09G 3/3648
See application file for complete search history.

(56) References Cited

U.S. PATENT DOCUMENTS

| | | | |
|---|---|---|---|
| 9,019,248 B2 | 4/2015 | Lee et al. | |
| 10,090,334 B2 | 10/2018 | Bae et al. | |
| 10,129,988 B2 | 11/2018 | Chen et al. | |
| 10,529,746 B2 | 1/2020 | Bae et al. | |
| 10,886,643 B2 | 1/2021 | Oh | |
| 2008/0119061 A1 | 5/2008 | Hwang et al. | |

(Continued)

FOREIGN PATENT DOCUMENTS

| | | |
|---|---|---|
| KR | 10-0881183 | 2/2009 |
| KR | 10-1204570 | 11/2012 |

(Continued)

*Primary Examiner* — Wing H Chow
(74) *Attorney, Agent, or Firm* — H.C. Park & Associates, PLC

(57) ABSTRACT

A display device includes a display substrate, a main circuit board, and first and second connection circuit boards. The display substrate includes a base layer, an insulating layer on the base layer, a first signal line on the base layer, a second signal line on the base layer, a first pad exposed from the insulating layer and connected to the first signal line, and a second pad connected to a side surface of the second signal line and disposed on a side surface and a bottom surface of the base layer. The first connection circuit board electrically connects the first pad and the main circuit board, and the second connection circuit board electrically connects the second pad and the main circuit board.

18 Claims, 12 Drawing Sheets

(56) References Cited

U.S. PATENT DOCUMENTS

| | | | |
|---|---|---|---|
| 2010/0032672 A1* | 2/2010 | Lo .................... | G02F 1/13458 |
| | | | 257/59 |
| 2012/0139884 A1 | 6/2012 | Lee et al. | |
| 2015/0084202 A1* | 3/2015 | Seidemann ............ | H01L 24/08 |
| | | | 257/773 |
| 2017/0358602 A1 | 12/2017 | Bae et al. | |
| 2018/0358385 A1 | 12/2018 | Bae et al. | |
| 2020/0142540 A1* | 5/2020 | Rahmani ............... | H05K 1/111 |

FOREIGN PATENT DOCUMENTS

| | | |
|---|---|---|
| KR | 10-2017-0139211 | 12/2017 |
| KR | 10-2019-0096463 | 8/2019 |

\* cited by examiner

DISPLAY DEVICE HAVING REDUCED NON-DISPLAY AREA

CROSS-REFERENCE TO RELATED APPLICATION

This application claims priority from and the benefit of Korean Patent Application No. 10-2019-0014687, filed on Feb. 8, 2019, which is hereby incorporated by reference for all purposes as if fully set forth herein.

BACKGROUND

Field

Exemplary embodiments of the invention relate generally to a display device, and more specifically, to a display device including a slim bezel area.

Discussion of the Background

Typically, a display panel may be manufactured, and then, a circuit board may be connected to the display panel. For example, in a tape automated bonding mounting method, the circuit board may be bonded to the display panel by using an anisotropic conductive film.

Recently, display panel designing techniques for reducing a bezel area (or a non-display area) have been variously studied.

The above information disclosed in this Background section is only for understanding of the background of the inventive concepts, and, therefore, it may contain information that does not constitute prior art.

SUMMARY

Devices constructed according to exemplary implementations of the invention are capable of reducing a defect rate of a bonding area.

Additional features of the inventive concepts will be set forth in the description which follows, and in part will be apparent from the description, or may be learned by practice of the inventive concepts.

In an exemplary embodiment of the inventive concepts, a display device includes a display substrate, a main circuit board, and first and second connection circuit boards. The display substrate includes a base layer, an insulating layer on the base layer, a first signal line on the base layer, a second signal line on the base layer, a first pad exposed from the insulating layer and connected to the first signal line, and a second pad connected to a side surface of the second signal line and disposed on a side surface and a bottom surface of the base layer. The first connection circuit board electrically connects the first pad and the main circuit board, and the second connection circuit board electrically connects the second pad and the main circuit board.

In an exemplary embodiment, the side surface of the second signal line may be substantially aligned with the side surface of the base layer.

In an exemplary embodiment, the side surface of the second signal line may be substantially aligned with a side surface of the insulating layer.

In an exemplary embodiment, the first pad may be connected to the first signal line through a contact hole penetrating the insulating layer.

In an exemplary embodiment, the first pad may be spaced apart from an edge of the insulating layer in a plan view.

In an exemplary embodiment, the first signal line and the second signal line may be disposed on the same layer.

In an exemplary embodiment, the second pad may include metal paste.

In an exemplary embodiment, the first pad may include silver (Ag), copper (Cu), gold (Au), or aluminum (Al).

In an exemplary embodiment, the first connection circuit board and the second connection circuit board may be bonded to the same surface of the main circuit board.

In an exemplary embodiment, the display device may further include a driving chip mounted on each of the first and second connection circuit boards.

In an exemplary embodiment, a width of a portion, overlapping with the driving chip, of the first connection circuit board may be less than a width of another portion, overlapping with the first pad, of the first connection circuit board.

In an exemplary embodiment, the first connection circuit board and the second connection circuit board may partially overlap with each other in a plan view.

In an exemplary embodiment, the first connection circuit board may overlap with the first pad and the second pad in a plan view.

In an exemplary embodiment, the display device may further include an anisotropic conductive film bonding the first pad to the first connection circuit board.

In an exemplary embodiment, the display device may further include a sealing member sealing a gap between the first connection circuit board and the insulating layer.

In an exemplary embodiment of the inventive concepts, a display device may include a display substrate, a main circuit board, and first and second connection circuit boards. The display substrate may include a base layer, an insulating layer on the base layer, a plurality of first signal lines on the base layer, a plurality of second signal lines on the base layer, a plurality of first pads connected to the plurality of first signal lines, respectively, and a plurality of second pads disposed on a side surface and a bottom surface of the base layer and connected to side surfaces of the plurality of second signal lines, respectively. The first connection circuit board may electrically connect the plurality of first pads to the main circuit board, and the second connection circuit board may electrically connect the plurality of second pads to the main circuit board.

In an exemplary embodiment, the first signal lines and the second signal lines may be alternately arranged in a direction.

In an exemplary embodiment, each of the plurality of first signal lines may be partially exposed from the insulating layer in an area overlapping with a corresponding one of the plurality of first pads, in an area where the insulating layer overlaps with the first connection circuit board. The plurality of second signal lines may not be exposed from the insulating layer in the area where the insulating layer overlaps with the first connection circuit board.

In an exemplary embodiment of the inventive concepts, a display device may include a display substrate, a main circuit board, and first and second connection circuit boards. The display substrate may include a base layer, an insulating layer on the base layer, a first signal line disposed on the base layer and partially exposed from the insulating layer through a contact hole defined in the insulating layer, a second signal line on the base layer, and a pad connected to a side surface of the second signal line and disposed on a side surface and a bottom surface of the base layer. The first connection circuit board may electrically connect the first signal line and the main circuit board, and the second connection circuit board may electrically connect the pad and the main circuit board.

In an exemplary embodiment, the first connection circuit board may be bonded to the display substrate on a top surface of the display substrate, and the second connection circuit board may be bonded to the display substrate on a bottom surface of the display substrate.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1A:
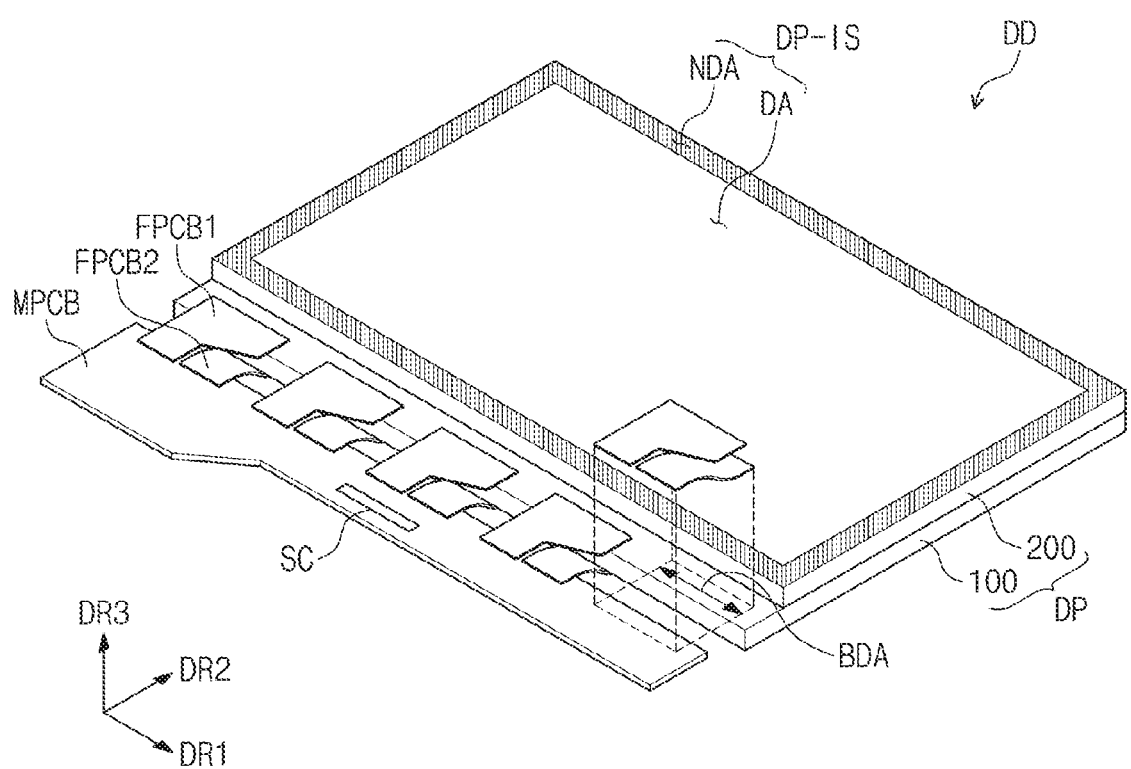
FIG. 1A is a perspective view illustrating a display device according to an exemplary embodiment of the inventive concepts.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side"

(e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 1B:
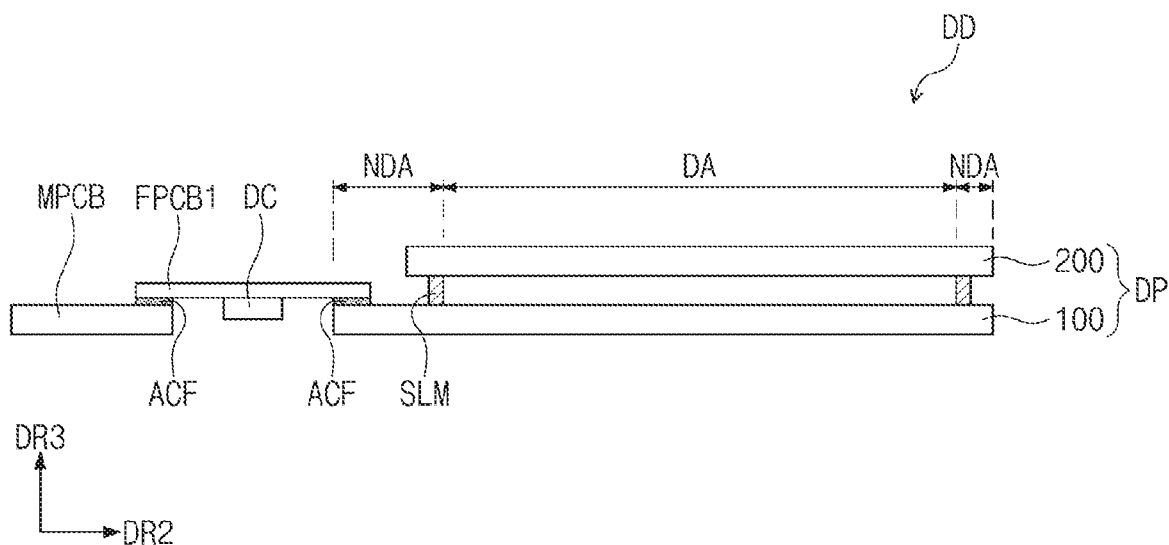
FIGS. 1B and 1C are cross-sectional views illustrating a display device according to an exemplary embodiment of the inventive concepts.
Figure 1C:
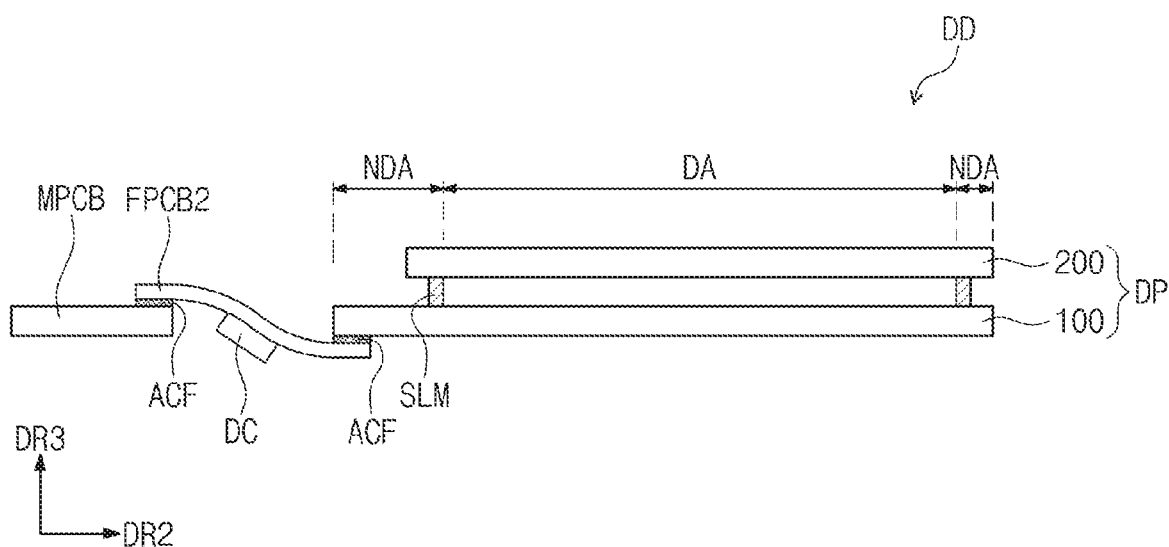
Figure 2:
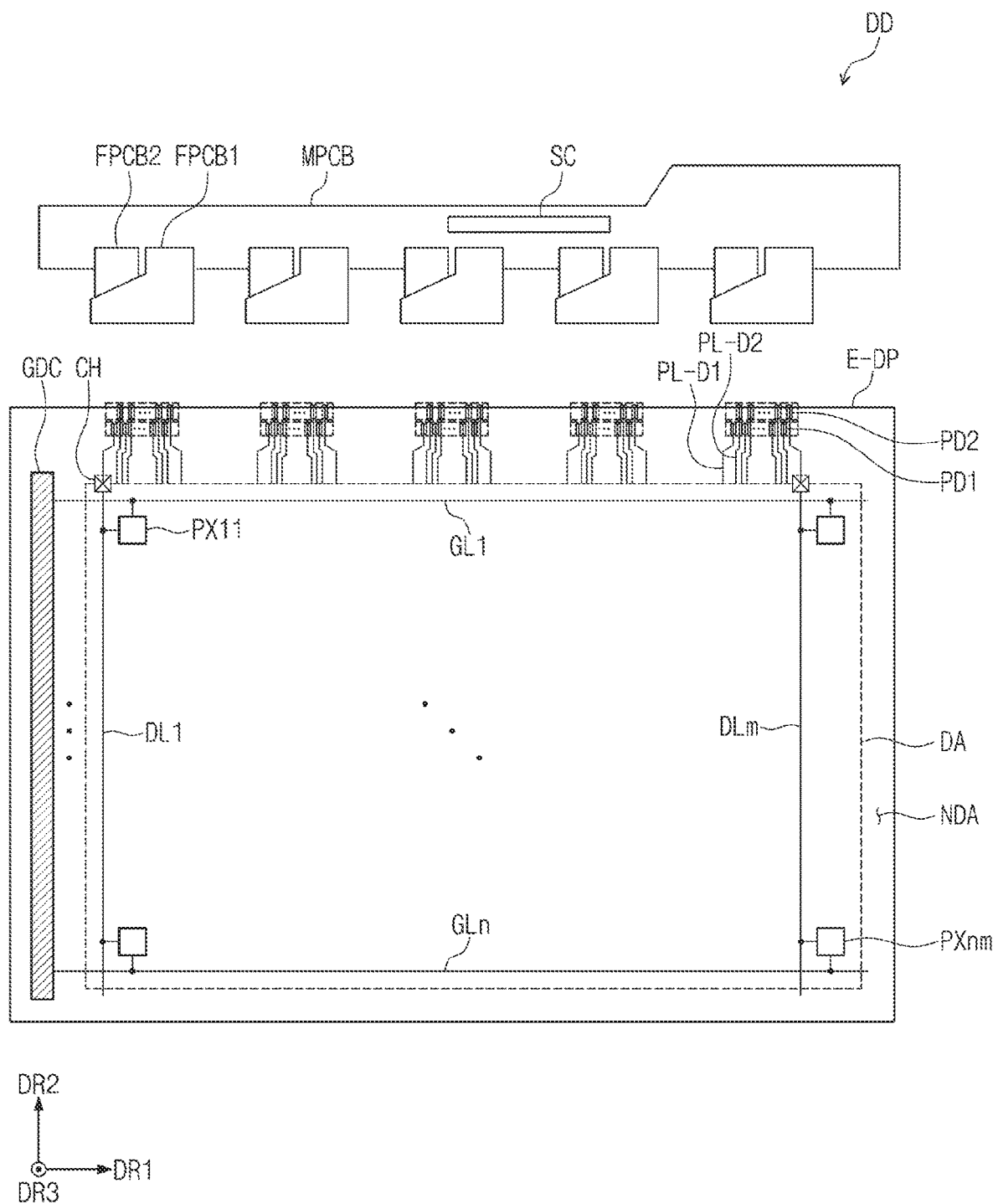
FIG. 2 is a plan view illustrating a display device according to an exemplary embodiment of the inventive concepts.

FIG. 1A is a perspective view illustrating a display device DD according to an exemplary embodiment of the inventive concepts. FIGS. 1B and 1C are cross-sectional views illustrating a display device DD according to an exemplary embodiment of the inventive concepts. FIG. 2 is a plan view illustrating a display device DD according to an exemplary embodiment of the inventive concepts.

Referring to FIGS. 1A, 1B, 1C, and 2, a display device DD may include a display panel DP, first and second connection circuit boards FPCB1 and FPCB2, and a main circuit board MPCB. In the present exemplary embodiment, driving chips DC may be mounted on the first and second connection circuit boards FPCB1 and FPCB2. However, exemplary embodiments of the inventive concepts are not limited thereto. In certain exemplary embodiments, the driving chip DC may not be mounted on the first and second connection circuit boards FPCB1 and FPCB2 but may be mounted on the display panel DP or the main circuit board MPCB.

The display device DD may further include a chassis member or a molding member and may further include a backlight unit in accordance with a kind of the display panel DP.

The display panel DP may be, but not limited to, a liquid crystal display panel, a plasma display panel, an electrophoretic display panel, a microelectromechanical system (MEMS) display panel, an electrowetting display panel, or a light emitting display panel.

The display panel DP may include a first display substrate 100 and a second display substrate 200 facing and spaced apart from the first display substrate 100. A cell gap may be formed between the first display substrate 100 and the second display substrate 200. The cell gap may be maintained by a sealant SLM coupling the first display substrate 100 and the second display substrate 200. A gray scale display layer for generating an image may be disposed between the first display substrate 100 and the second display substrate 200. The gray scale display layer may include a liquid crystal layer, a light emitting layer, or an electrophoretic layer, in accordance with a kind of the display panel DP.

As illustrated in FIG. 1A, the display panel DP may display an image through a display surface DP-IS. The display surface DP-IS may be parallel to a plane defined by a first directional axis DR1 and a second directional axis DR2. The display surface DP-IS may include a display area DA and a non-display area NDA. The non-display area NDA may be defined along a border of the display surface DP-IS. The display area DA may be surrounded by the non-display area NDA. In a certain exemplary embodiment, the non-display area NDA may be disposed at only a side of the display area DA. In the corresponding area, the first and second connection circuit boards FPCB1 and FPCB2 may be bonded to the first display substrate 100.

A normal direction of the display surface DP-IS (i.e., a thickness direction of the display panel DP) may be indicated by a third directional axis DR3. Hereinafter, a front surface (or a top surface) and a rear surface (or a bottom surface) of each of layers or units may be defined by the third directional axis DR3. However, the first to third directional axes DR1, DR2 and DR3 of the present exemplary embodiment are illustrated as an example. Hereinafter, first to third directions are defined as directions indicated by the first to third directional axes DR1, DR2 and DR3, respectively, and are indicated by the same reference designators as the first to third directional axes DR1, DR2 and DR3, respectively.

The display panel DP having the planar display surface DP-IS is illustrated in the present exemplary embodiment. However, exemplary embodiments of the inventive concepts are not limited thereto. In other exemplary embodiments, the display device DD may include a curved display surface or a three-dimensional (3D) display surface. The 3D display surface may include a plurality of display areas indicated by different directions.

A signal controller SC may be mounted on the main circuit board MPCB. The signal controller SC may receive image data and control signals from an external graphic controller. The signal controller SC may provide the control signals to the display panel DP.

The first and second connection circuit boards FPCB1 and FPCB2 may electrically connect the display panel DP and the main circuit board MPCB. The first and second connection circuit boards FPCB1 and FPCB2 may transmit signals from the main circuit board MPCB to the driving chips DC and may transmit signals from the driving chips DC to the display panel DP. In the present exemplary embodiment, the driving chip DC may be a data driving circuit. In an exemplary embodiment, the first and second connection circuit boards FPCB1 and FPCB2 may transmit signals from the signal controller SC to the display panel DP.

Each of the first and second connection circuit boards FPCB1 and FPCB2 may be bonded to each of the display panel DP and the main circuit board MPCB by a conductive adhesive member. The conductive adhesive member may include a solder ball, solder paste, or an anisotropic conductive film. Hereinafter, the anisotropic conductive film will be described as an example of the conductive adhesive member.

As illustrated in FIG. 1A, the first display substrate 100 may include a plurality of bonding areas BDA. The first and second connection circuit boards FPCB1 and FPCB2 may be bonded to each of the plurality of bonding areas BDA.

As illustrated in FIG. 1B, the first connection circuit board FPCB1 may be bonded onto a top surface of the first display substrate 100. As illustrated in FIG. 1C, the second connection circuit board FPCB2 may be bonded onto a bottom surface of the first display substrate 100. In FIGS. 1B and 1C, anisotropic conductive films ACF are illustrated as the conductive adhesive members.

In the present exemplary embodiment, the bonding area BDA is disposed in a lower display substrate. However, exemplary embodiments of the inventive concepts are not limited thereto. The bonding area BDA is disposed in a display substrate on which signal lines and pads are disposed. In an exemplary embodiment, the first and second display substrates 100 and 200 may be turned over, and in this case, the bonding area BDA may be disposed in an upper display substrate.

FIG. 2 illustrates planar arrangement of signal lines GL1 to GLn, DL1 to DLm, PL-D1 and PL-D2 and pixels PX11 to PXnm. The signal lines GL1 to GLn, DL1 to DLm, PL-D1 and PL-D2 may include a plurality of gate lines GL1 to GLn, a plurality of data lines DL1 to DLm, and auxiliary signal lines PL-D1 and PL-D2.

Each of the pixels PX11 to PXnm may be connected to a corresponding one of the plurality of gate lines GL1 to GLn and a corresponding one of the plurality of data lines DL1 to DLm. Each of the pixels PX11 to PXnm may include a pixel driving circuit and a display element.

The pixels PX11 to PXnm arranged in a matrix form are illustrated as an example in FIG. 2. However, exemplary embodiments of the inventive concepts are not limited thereto. In another exemplary embodiment, the pixels PX11 to PXnm may be arranged in a PenTile form. In still another exemplary embodiment, the pixels PX11 to PXnm may be arranged in a diamond form.

The gate lines GL1 to GLn may extend in the first direction DR1 and may be arranged in the second direction DR2, and the data lines DL1 to DLm may be insulated from the gate lines GL1 to GLn and may intersect the gate lines GL1 to GLn. The gate lines GL1 to GLn and the data lines DL1 to DLm may overlap with the display area DA. The auxiliary signal lines PL-D1 and PL-D2 may overlap with the non-display area NDA and may be connected to the data lines DL1 to DLm.

The plurality of gate lines GL1 to GLn may be connected to a gate driving circuit GDC. The gate driving circuit GDC may be integrated in the display panel DP by an oxide silicon gate driving circuit (OSG) process or an amorphous silicon gate driving circuit (ASG) process.

The auxiliary signal lines PL-D1 and PL-D2 may include first auxiliary signal lines PL-D1 connected to first pads PD1, and second auxiliary signal lines PL-D2 connected to second pads PD2. As a resolution of the display panel DP increases, areas of the pixels PX11 to PXnm may decrease and the number of the pixels PX11 to PXnm in a unit area may increase. If pads are arranged in a line, a large-area bonding area may be required and a defect (e.g., a short between the pads) may occur. A design of pads having a fine pitch may be required to prevent these limitations. However, the pads having the fine pitch may cause a bonding defect. According to the present exemplary embodiment, the pads may be arranged in two groups (e.g., two rows) such as the first pads PD1 and the second pads PD2 to solve the above limitations.

The first pads PD1 may be arranged in the first direction DR1, and the second pads PD2 may be arranged in the first direction DR1 to constitute a different row from a row of the first pads PD1. The first auxiliary signal lines PL-D1 and the second auxiliary signal lines PL-D2 may be alternately arranged.

The first and second auxiliary signal lines PL-D1 and PL-D2 connected to the data lines DL1 to DLm may be disposed on a layer different from a layer on which the data lines DL1 to DLm are disposed. The first and second auxiliary signal lines PL-D1 and PL-D2 may be disposed on the same layer. For example, the first and second auxiliary signal lines PL-D1 and PL-D2 may be disposed on the same layer as the gate lines GL1 to GLn. Each of the first and second auxiliary signal lines PL-D1 and PL-D2 may be electrically connected to a corresponding one of the data lines DL1 to DLm through a contact hole CH. The contact hole CH may penetrate at least one insulating layer disposed between the data lines DL1 to DLm and the first and second auxiliary signal lines PL-D1 and PL-D2. In FIG. 2, two contact holes CH are illustrated as an example.

In an exemplary embodiment, the contact hole CH may be omitted. The data lines DL1 to DLm and the first and second auxiliary signal lines PL-D1 and PL-D2 may be disposed on the same layer. In this case, each of the data lines DL1 to DLm and each of the first and second auxiliary signal lines PL-D1 and PL-D2, which are connected to each other, may not be distinguished from each other but may be defined as one signal line. Here, the data line and the auxiliary signal line connected to each other may correspond to different portions of the one signal line. In other words, the first and second auxiliary signal lines PL-D1 and PL-D2 are provided separately in the present exemplary embodiment. Alternatively, the first and second auxiliary signal lines PL-D1 and PL-D2 may be omitted, and portions of signal lines may replace the first and second auxiliary signal lines PL-D1 and PL-D2.

Figure 3A:
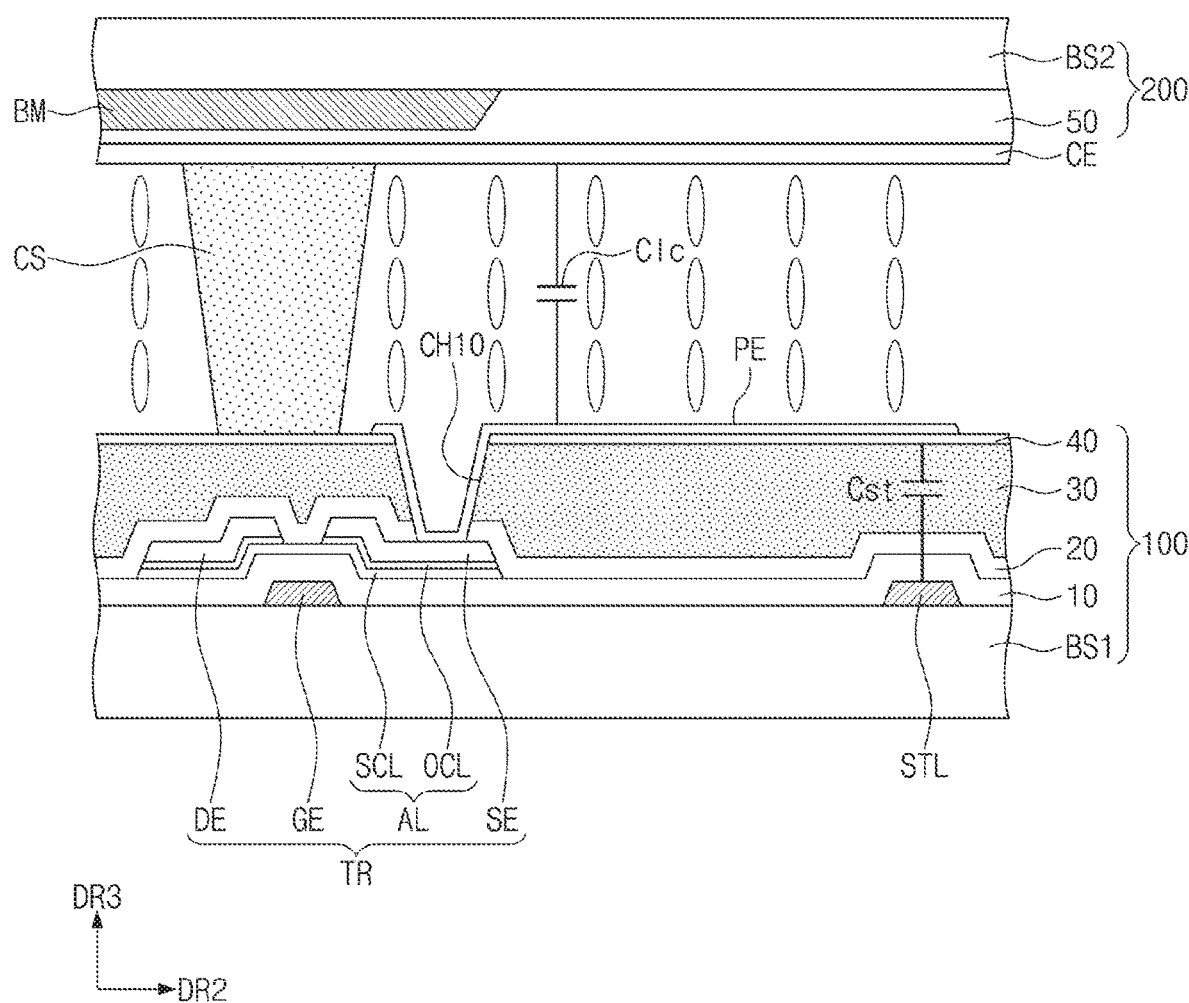
FIGS. 3A and 3B are cross-sectional views illustrating display areas of display panels according to some exemplary embodiments of the inventive concepts.
Figure 3B:
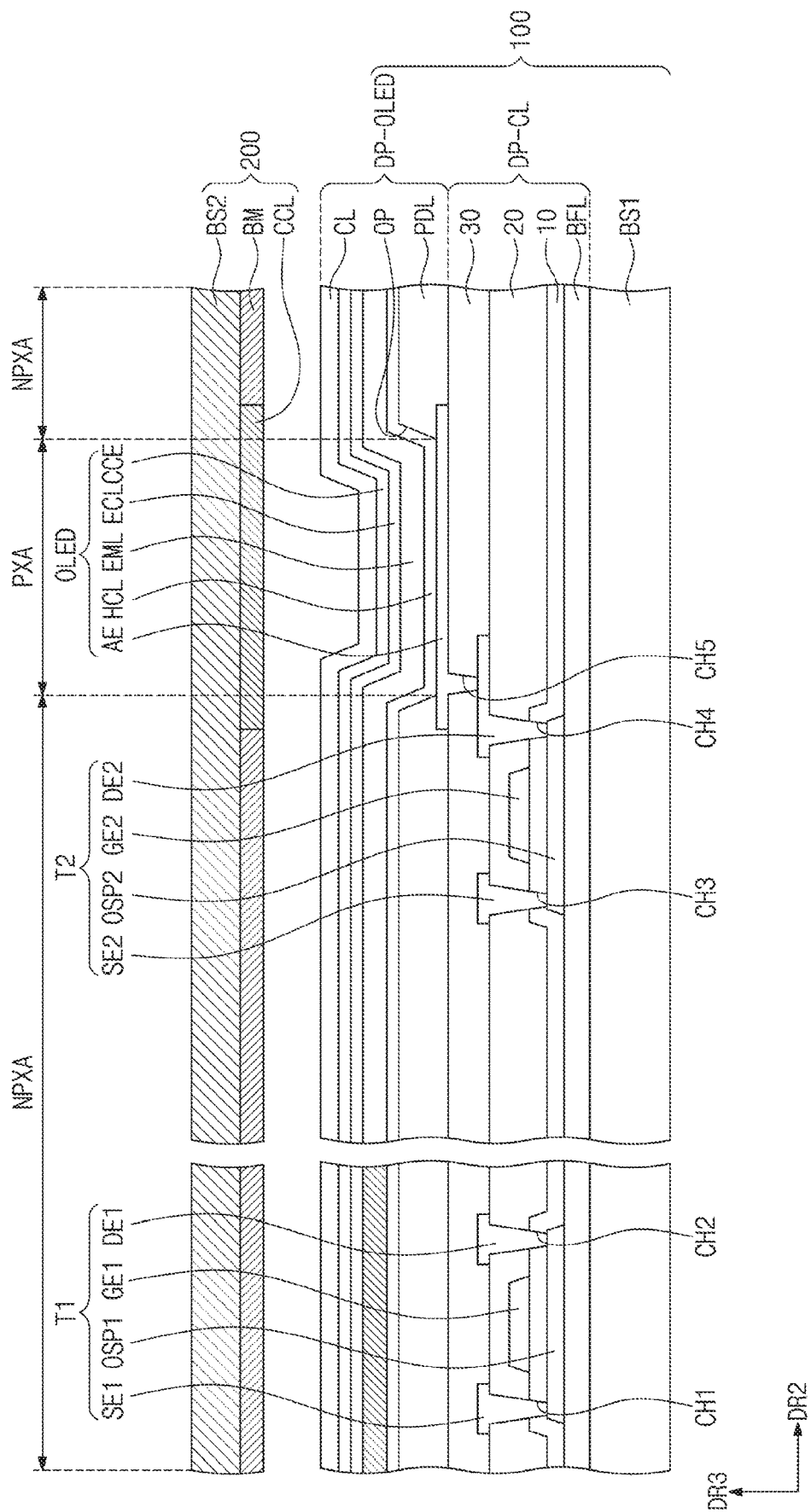

FIGS. 3A and 3B are cross-sectional views illustrating display areas DA of display panels DP according to some exemplary embodiments of the inventive concepts. FIG. 3A illustrates a cross-sectional view corresponding to a pixel PX of a liquid crystal display panel, and FIG. 3B illustrates a cross-sectional view corresponding to a pixel PX of an organic light emitting display panel.

The pixel PX of the liquid crystal display panel may include a transistor TR, a liquid crystal capacitor Clc, and a storage capacitor Cst.

The transistor TR may include a control electrode GE connected to a gate line, an active part AL overlapping with the control electrode GE, an input electrode DE connected to a data line, and an output electrode SE spaced apart from the input electrode DE. The liquid crystal capacitor Clc may include a pixel electrode PE and a common electrode CE. The storage capacitor Cst may include the pixel electrode PE and a portion of a storage line STL overlapping with the pixel electrode PE.

The control electrode GE and the storage line STL may be disposed on one surface of a first base layer BS1. The first base layer BS1 may be a glass substrate or a plastic substrate. At least one insulating layer and at least one conductive pattern may be disposed on the one surface of the first base layer BS1.

A first insulating layer 10 may be disposed on the one surface of the first base layer BS1 and may cover the control electrode GE and the storage line STL. The first insulating layer 10 may include at least one of an inorganic material or an organic material. The active part AL overlapping with the control electrode GE may be disposed on the first insulating layer 10. The active part AL may include a semiconductor layer SCL and an ohmic contact layer OCL. The semiconductor layer SCL may be disposed on the first insulating layer 10, and the ohmic contact layer OCL may be disposed on the semiconductor layer SCL.

The semiconductor layer SCL may include amorphous silicon or poly-silicon. Alternatively, the semiconductor layer SCL may include a metal oxide semiconductor. The ohmic contact layer OCL may be doped with dopants. A concentration of the dopants in the ohmic contact layer OCL may be higher than a concentration of dopants in the semiconductor layer SCL. The ohmic contact layer OCL may include two portions spaced apart from each other. In an exemplary embodiment of the inventive concepts, the ohmic contact layer OCL may have a shape of a single unitary body.

The input electrode DE and the output electrode SE may be disposed on the active part AL. The input electrode DE and the output electrode SE may be spaced apart from each other. A second insulating layer 20 may be disposed on the first insulating layer 10 and may cover the active part AL, the input electrode DE, and the output electrode SE. A third insulating layer 30 may be disposed on the second insulating layer 20. Each of the second and third insulating layers 20 and 30 may include at least one of an inorganic material or organic material. The third insulating layer 30 may be a single-layered organic layer providing a flat surface. In the present exemplary embodiment, the third insulating layer 30 may include a plurality of color filters. A fourth insulating layer 40 may be disposed on the third insulating layer 30. The fourth insulating layer 40 may be an inorganic layer covering the color filters.

As illustrated in FIG. 3A, the pixel electrode PE may be disposed on the fourth insulating layer 40. The pixel electrode PE may be connected to the output electrode SE through a contact hole CH10 penetrating the second, third and fourth insulating layers 20, 30 and 40. An alignment layer covering the pixel electrode PE may be disposed on the fourth insulating layer 40.

A second base layer BS2 may be a glass substrate or a plastic substrate. A black matrix layer BM may be disposed on a bottom surface of the second base layer BS2. Openings corresponding to pixel areas may be defined in the black matrix layer BM. A spacer CS may overlap with the black matrix layer BM.

At least one insulating layer covering the black matrix layer BM may be disposed on the bottom surface of the second base layer BS2. A fifth insulating layer 50 providing a flat surface is illustrated as an example in FIG. 3A. The fifth insulating layer 50 may include an organic material.

As illustrated in FIG. 3A, the common electrode CE may be disposed on the bottom surface of the second base layer BS2. A common voltage may be applied to the common electrode CE. A level of the common voltage may be different from that of a pixel voltage.

The liquid crystal display panel of a vertical alignment (VA) mode is illustrated as an example in FIG. 3A. However, exemplary embodiments of the inventive concepts are not limited thereto. In other exemplary embodiments, the display panel DP may be a liquid crystal display panel of an in-plane switching (IPS) mode, a fringe-field switching (FFS) mode, a plane-to-line switching (PLS) mode, a super vertical alignment (SVA) mode, or a surface-stabilized vertical alignment (SS-VA) mode.

As illustrated in FIG. 3B, the pixel PX of the organic light emitting display panel may include a switching transistor T1, a driving transistor T2, and a light emitting element OLED.

The organic light emitting display panel may include a first display substrate 100 and a second display substrate 200. The display substrate 100 may include a first base layer BS1, a circuit element layer DP-CL disposed on the first base layer BS1, and a display element layer DP-OLED disposed on the circuit element layer DP-CL. The second display substrate 200 may include a second base layer BS2, and a black matrix layer BM and a color control layer CCL which are disposed on a bottom surface of the second base layer BS2.

The first base layer BS1 may include a synthetic resin substrate or a glass substrate. The circuit element layer DP-CL may include at least one insulating layer and a circuit element. The circuit element may include a signal line and a driving circuit of the pixel. The circuit element layer DP-CL may be formed through processes of forming the insulating layer, a semiconductor layer and a conductive layer using coating and/or deposition processes and processes of patterning the insulating layer, the semiconductor layer and the conductive layer using photolithography processes.

In the present exemplary embodiment, the circuit element layer DP-CL may include a buffer layer BFL, a first insulating layer 10, a second insulating layer 20, and a third insulating layer 30. The first insulating layer 10 and the second insulating layer 20 may be inorganic layers, and the third insulating layer 30 may be an organic layer.

FIG. 3B illustrates arrangement relation of a first semiconductor pattern OSP1, a second semiconductor pattern OSP2, a first control electrode GE1, a second control electrode GE2, a first input electrode SE1, a first output electrode DE1, a second input electrode SE2 and a second output electrode DE2, which constitute the switching transistor T1 and the driving transistor T2. First, second, third and fourth through-holes CH1, CH2, CH3 and CH4 are also illustrated as an example in FIG. 3B.

The display element layer DP-OLED may include the light emitting element OLED. The light emitting element OLED may include a light emitting diode. The light emitting element OLED may include an organic light emitting layer or a quantum-dot light emitting layer. The display element layer DP-OLED may include a pixel defining layer PDL. For example, the pixel defining layer PDL may be an organic layer. The display element layer DP-OLED may further include a cover layer CL disposed on the light emitting element OLED.

A first electrode AE may be disposed on the third insulating layer 30. The first electrode AE may be connected to the second output electrode DE2 through a fifth through-hole CH5 penetrating the third insulating layer 30. An opening OP may be defined in the pixel defining layer PDL. The opening OP of the pixel defining layer PDL may expose at least a portion of the first electrode AE.

As illustrated in FIG. 3B, the display panel DP may include a light emitting area PXA and a non-light emitting area NPXA adjacent to the light emitting area PXA. The non-light emitting area NPXA may surround the light emitting area PXA. In the present exemplary embodiment, the light emitting area PXA is defined to correspond to a partial area of the first electrode AE, which is exposed through the opening OP.

A hole control layer HCL may be disposed in common in the light emitting area PXA and the non-light emitting area NPXA. The hole control layer HCL may include a hole transfer layer and may further include a hole injection layer. A light emitting layer EML may be disposed on the hole control layer HCL. The light emitting layer EML may be disposed in common in the light emitting area PXA and the non-light emitting area NPXA. Alternatively, the light emitting layer EML may be disposed in the light emitting area PXA but may not be disposed in the non-light emitting area NPXA. The light emitting layer EML may include an organic material and/or an inorganic material. The light emitting layer EML may generate first color light, for example, blue light.

An electron control layer ECL may be disposed on the light emitting layer EML. The electron control layer ECL may include an electron transfer layer and may further include an electron injection layer. The hole control layer HCL and the electron control layer ECL may be formed in common in a plurality of the pixels by using an open mask. A second electrode CCE may be disposed on the electron control layer ECL. The second electrode CCE may be disposed in common in the plurality of pixels. The cover layer CL may be disposed on the second electrode CCE to protect the second electrode CCE. The cover layer CL may include an organic material or an inorganic material.

The second base layer BS2 may be spaced apart from the cover layer CL. The second base layer BS2 may include a synthetic resin substrate or a glass substrate. Depending on the pixel, the color control layer CCL may transmit the first color light or may convert the first color light into second color light or third color light. The color control layer CCL may include quantum dots. The pixels PX11 to PXnm (see FIG. 2) may be divided into a plurality of pixel groups. Different kinds of the color control layers CCL may be disposed in the pixel groups, respectively.

In an exemplary embodiment of the inventive concepts, the second display substrate 200 may be replaced with a thin film encapsulation layer. In this case, the black matrix layer BM and the color control layer CCL may be disposed on the thin film encapsulation layer.

Figure 4A:
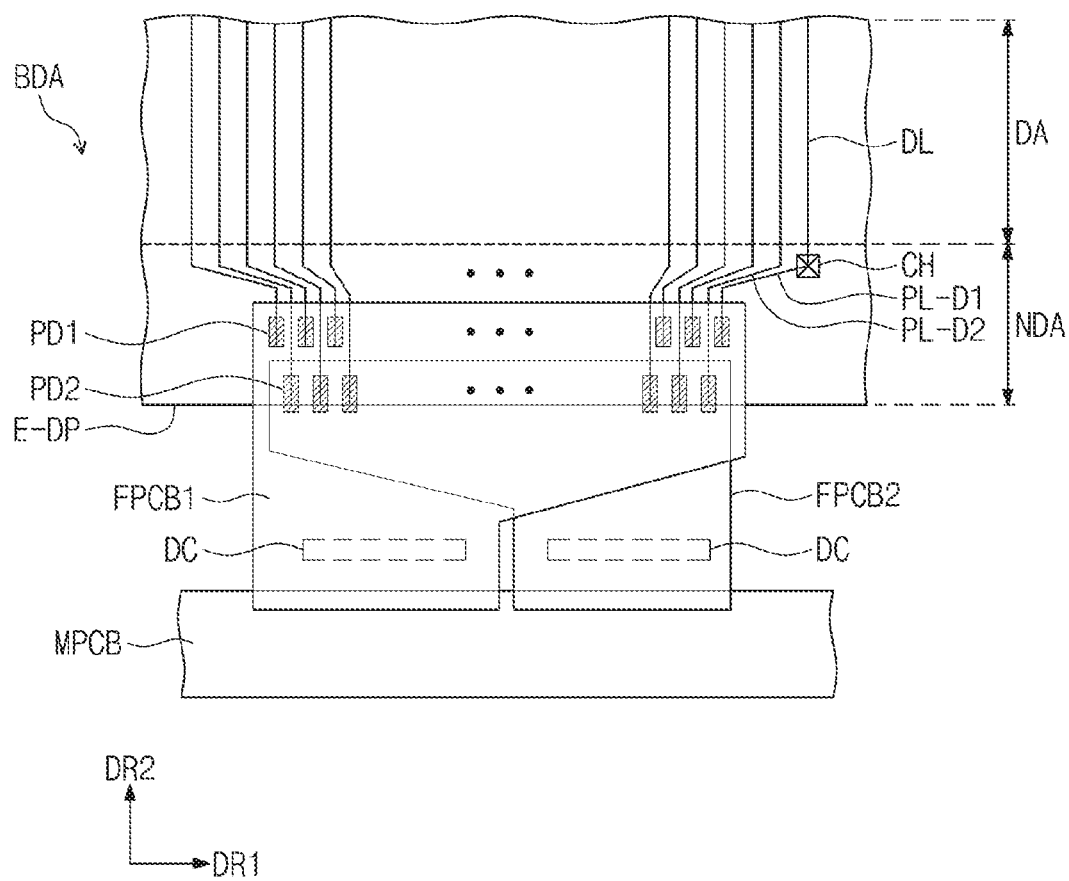
FIG. 4A is an enlarged plan view illustrating a display device according to an exemplary embodiment of the inventive concepts.
Figure 4B:
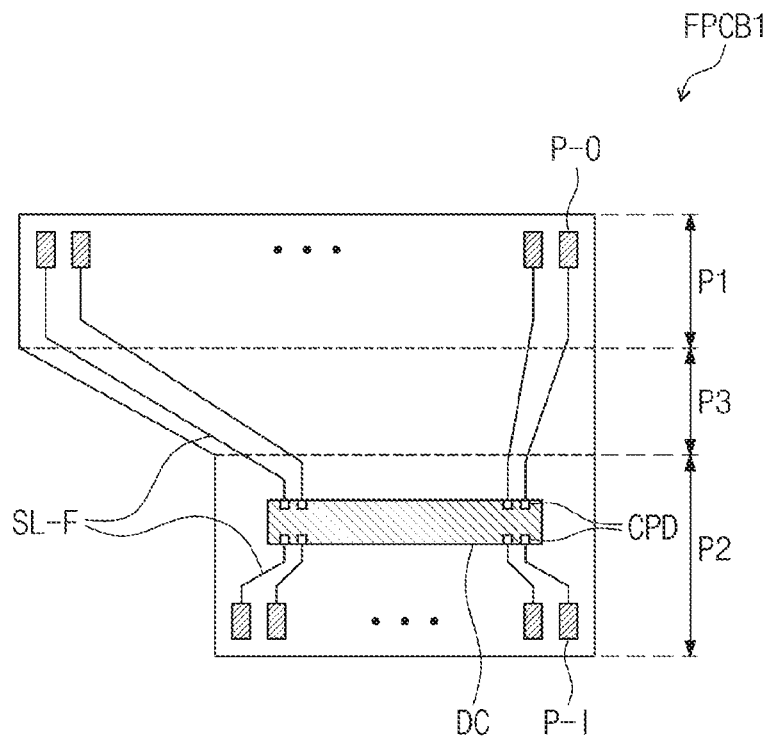
FIG. 4B is a rear view illustrating a connection circuit board according to an exemplary embodiment of the inventive concepts.
Figure 4C:
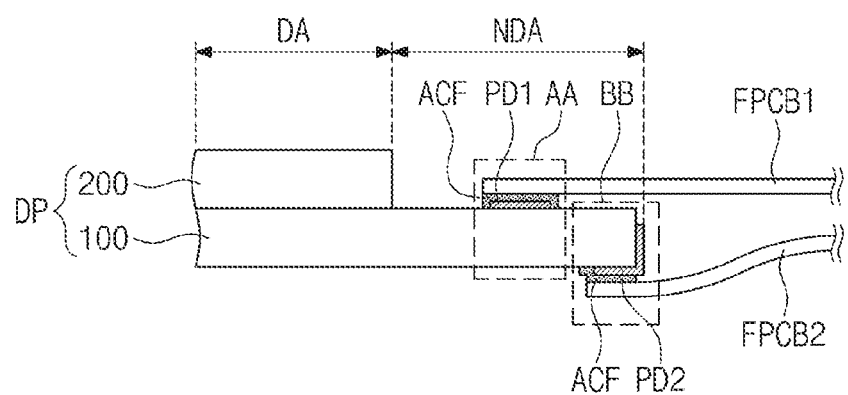
FIG. 4C is a cross-sectional view illustrating a display device according to an exemplary embodiment of the inventive concepts.
Figure 4D:
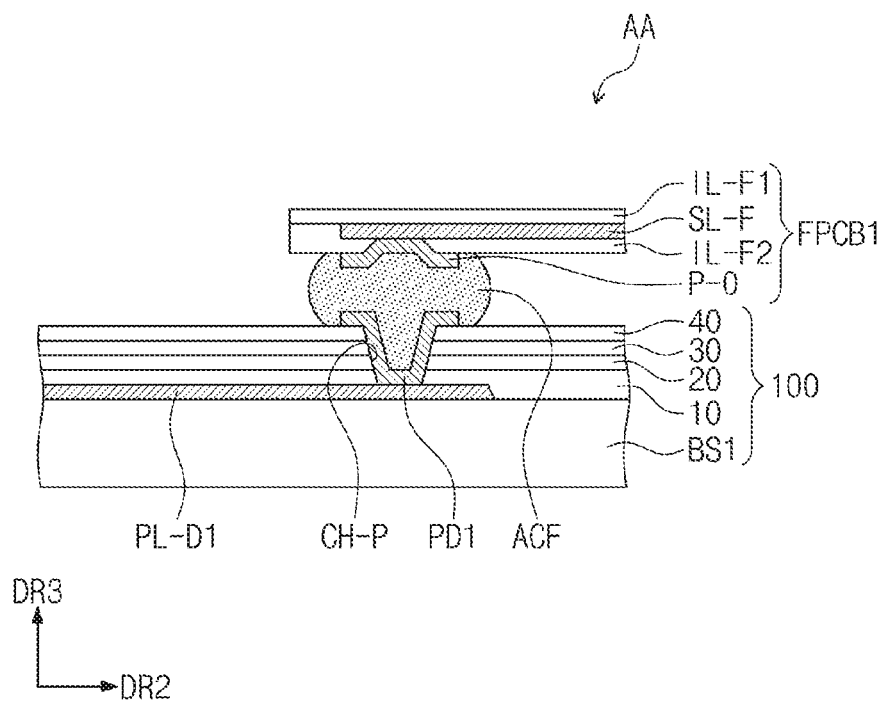
FIGS. 4D and 4E are enlarged cross-sectional views of areas of FIG. 4C.
Figure 4E:
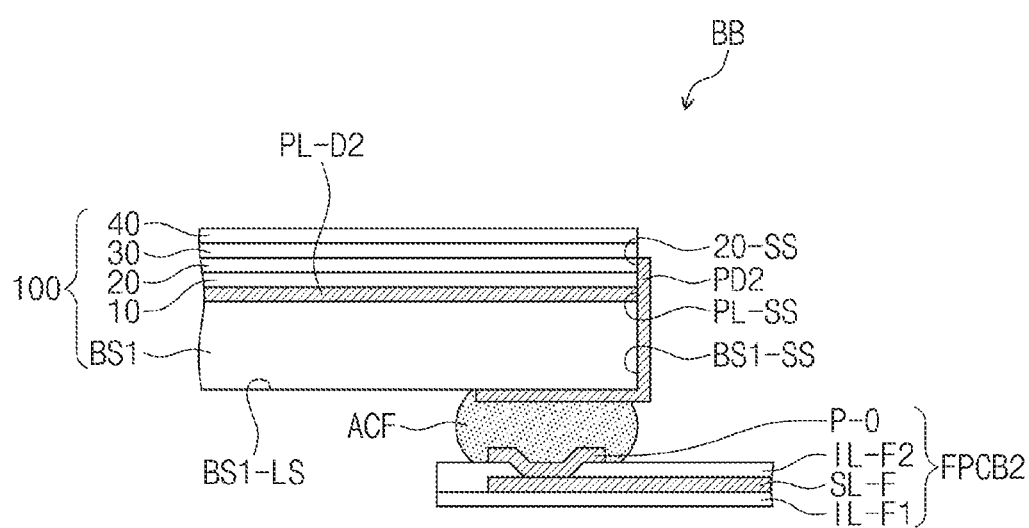
Figure 4F:
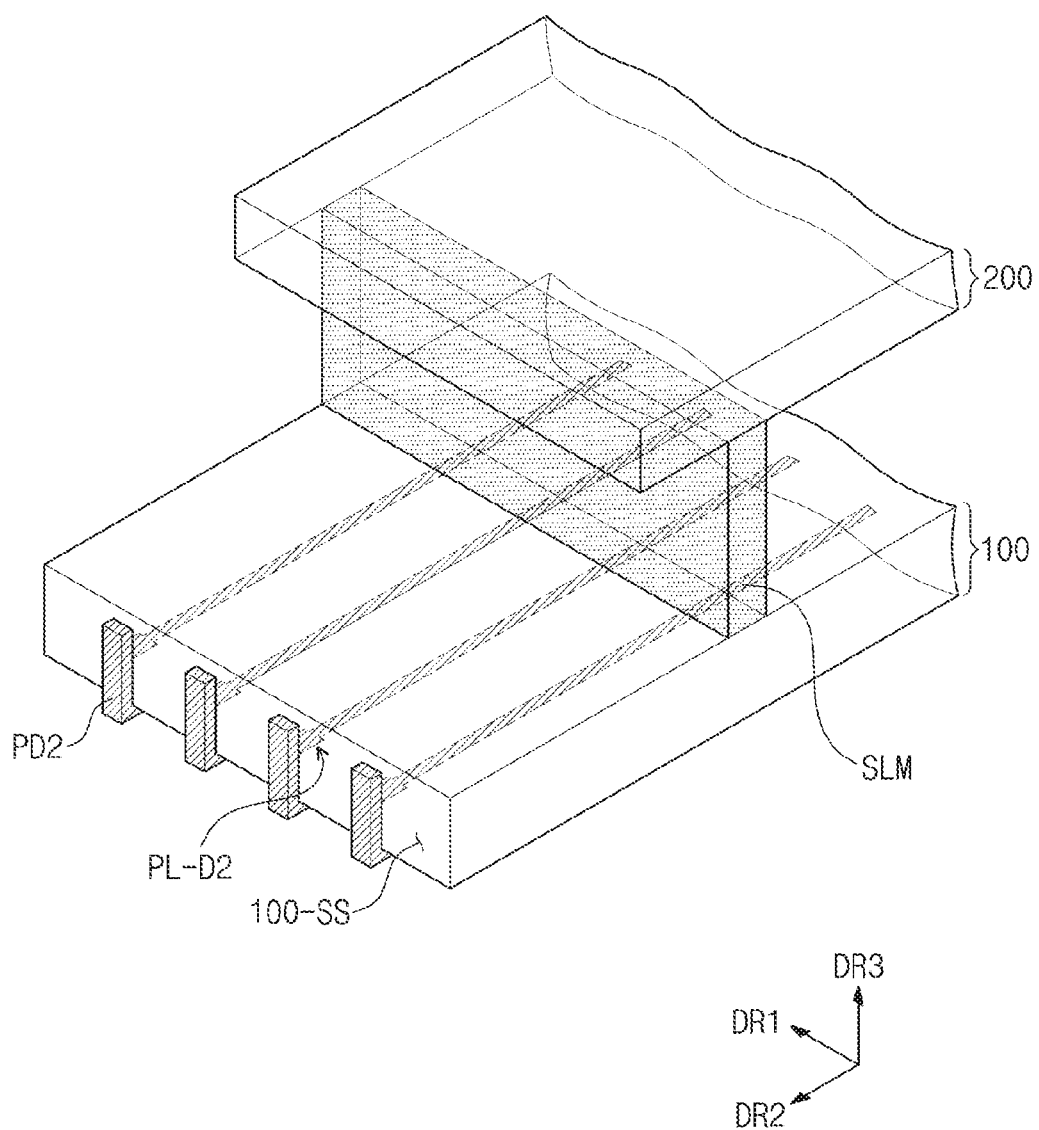
FIG. 4F is an enlarged perspective view illustrating a display device according to an exemplary embodiment of the inventive concepts.

FIG. 4A is an enlarged plan view illustrating the display device DD according to an exemplary embodiment of the inventive concepts. FIG. 4B is a rear view illustrating the connection circuit board FPCB1 according to an exemplary embodiment of the inventive concepts. FIG. 4C is a cross-sectional view illustrating the display device DD according to an exemplary embodiment of the inventive concepts. FIGS. 4D and 4E are enlarged cross-sectional views of areas of FIG. 4C. FIG. 4F is an enlarged perspective view illustrating the display device DD according to an exemplary embodiment of the inventive concepts.

As illustrated in FIG. 4A, the first connection circuit board FPCB1 may be connected to the first pads PD1, and the second connection circuit board FPCB2 may be connected to the second pads PD2. The first pads PD1 may be spaced apart from an edge E-DP of the first display substrate 100 in the second direction DR2 in a plan view. The edge E-DP of the first display substrate 100 may be substantially the same as edges of the insulating layers of the first display substrate 100 in a plan view.

The first connection circuit board FPCB1 may overlap with the first pads PD1 and the second pads PD2 in a plan view. The second pads PD2 may be closer to the edge E-DP of the first display substrate 100 than the first pads PD1.

Edges of the second pads PD2 may be aligned with the edge E-DP of the first display substrate 100 in a plan view. This may be because a side surface of the first display substrate 100 is polished or ground to expose side surfaces of the second pads PD2 in a process of manufacturing the display panel DP.

A size and a shape of the first connection circuit board FPCB1 may be partially different from those of the second connection circuit board FPCB2. However, the first and second connection circuit boards FPCB1 and FPCB2 may have very similar structures to each other. The first connection circuit board FPCB1 is illustrated as an example in FIG. 4B. Hereinafter, the first connection circuit board FPCB1 will be mainly described.

The first connection circuit board FPCB1 may include an insulating layer, a plurality of pads CPD, P-O and P-I, and a plurality of signal lines SL-F. The plurality of pads CPD, P-O and P-I and the plurality of signal lines SL-F may be disposed on the insulating layer. The insulating layer may include a polyimide layer.

The plurality of pads CPD, P-O and P-I may include connection pads CPD connected to connection terminals of the driving chip DC, first pads (hereinafter, referred to as output pads) P-O connected to the display panel DP, and second pads (hereinafter, referred to as input pads) P-I connected to the main circuit board MPCB. The plurality of signal lines SL-F may connect the connection pads CPD and the output pads P-O and may connect the connection pads CPD and the input pads P-I. When the driving chip DC is omitted, the signal lines SL-F may connect the output pads P-O and the input pads P-I.

The plurality of pads CPD, P-O and P-I of the first connection circuit board FPCB1 may be exposed to the outside. Each of the plurality of pads CPD, P-O and P-I may be connected to a corresponding signal line SL-F through a contact hole penetrating the insulating layer.

The first connection circuit board FPCB1 may include three portions divided according to a width in the first direction DR1. In detail, the first connection circuit board FPCB1 may include a first portion P1 on which the output pads P-O are disposed, a second portion P2 on which the input pads P-I are disposed, and a third portion P3 connecting the first portion P1 and the second portion P2. A width of the first portion P1 may be greater than a width of the second portion P2. A width of the third portion P3 may become progressively less from the first portion P1 toward the second portion P2. The driving chip DC may be mounted on the second portion P2.

All of the output pads P-O, the input pads P-I and the connection pads CPD of the first connection circuit board FPCB1 may be exposed to the outside at a rear surface of the first connection circuit board FPCB1. On the other hand, output pads P-O of the second connection circuit board FPCB2 of FIG. 4A may be exposed to the outside at a front surface of the second connection circuit board FPCB2, and input pads P-I and connection pads CPD of the second connection circuit board FPCB2 may be exposed to the outside at a rear surface of the second connection circuit board FPCB2. Thus, as illustrated in FIG. 4A, the first connection circuit board FPCB1 and the second connection circuit board FPCB2 may be bonded to the same surface of the main circuit board MPCB. However, the bonding structure of the first and second connection circuit boards FPCB1 and FPCB2 to the main circuit board MPCB is not limited thereto.

As illustrated in FIGS. 4A and 4C, the first connection circuit board FPCB1 and the second connection circuit board FPCB2 which are disposed in one bonding area BDA may partially overlap with each other in a plan view. However, the first connection circuit board FPCB1 and the second connection circuit board FPCB2 may be bonded to different surfaces of the first display substrate 100, and thus physical interference of the first and second connection circuit boards FPCB1 and FPCB2 may be minimized.

Since each of the first and second connection circuit boards FPCB1 and FPCB2 has the shape including areas (or portions) having different widths, the areas (e.g., the second portions P2 of FIG. 4B) of the first and second connection circuit boards FPCB1 and FPCB2 which are adjacent to the main circuit board MPCB may not overlap with each other in a plan view. Thus, the physical interference of the first and second connection circuit boards FPCB1 and FPCB2 may be minimized.

FIG. 4D is an enlarged view of an area 'AA' of FIG. 4C. The first connection circuit board FPCB1 including a first insulating layer IL-F1, the signal line SL-F, a second insulating layer IL-F2, and the output pad P-O is illustrated as an example in FIG. 4D. As illustrated in FIG. 4D, the first pad PD1 may be exposed from the insulating layer and may be connected to the signal line. The first pad PD1 which is connected to the first auxiliary signal line PL-D1 through a contact hole CH-P penetrating first to fourth insulating layers 10 to 40 is illustrated as an example. The first pad PD1 may include silver (Ag), copper (Cu), gold (Au), or aluminum (Al).

The first pad PD1 may be electrically connected to the output pad P-O through an anisotropic conductive film ACF. In another exemplary embodiment, the first pad PD1 may be omitted. In this case, the anisotropic conductive film ACF may be connected directly to the first auxiliary signal line PL-D1.

FIG. 4E is an enlarged view of an area 'BB' of FIG. 4C. The second connection circuit board FPCB2 including a first insulating layer IL-F1, the signal line SL-F, a second insulating layer IL-F2, and the output pad P-O is illustrated as an example in FIG. 4E. As illustrated in FIG. 4E, the second pad PD2 may be connected to a side surface of a signal line and may be disposed on a side surface BS1-SS and a bottom surface BS1-LS of the first base layer BS1. The second auxiliary signal line PL-D2 is illustrated as an example of the signal line in FIG. 4E.

An anisotropic conductive film ACF may be bonded to a portion of the second pad PD2, which is disposed on the bottom surface BS1-LS of the first base layer BS1.

A side surface of the second auxiliary signal line PL-D2 may be substantially aligned with the side surface BS1-SS of the first base layer BS1. The side surface of the second auxiliary signal line PL-D2 may be substantially aligned with side surfaces of the first to fourth insulating layers 10 to 40. A reference designator 20-SS of the side surface of the second insulating layer 20 is shown as a representative of the side surfaces of the insulating layers 10 to 40.

In another exemplary embodiment, the side surface of at least one (e.g., an organic insulating layer) of the first to fourth insulating layers 10 to 40 may not be aligned with the side surfaces of others of the first to fourth insulating layers 10 to 40. In other words, it may not be necessary that the side surfaces of all insulating layers are aligned with each other.

As illustrated in FIG. 4F, a plurality of the second pads PD2 may be spaced apart from each other by predetermined distances on a side surface 100-SS of the first display substrate 100. Metal paste may be printed on the side surface 100-SS and a bottom surface of the first display substrate 100 and then may be patterned to form the plurality of second pads PD2. The printing and patterning processes of the metal paste are not limited to specific processes. The metal paste may be silver paste.

Referring to FIGS. 4D and 4E, in an area where the insulating layer (e.g., the fourth insulating layer 40) overlaps with the first connection circuit board FPCB1, the first auxiliary signal line PL-D1 may be partially exposed from the fourth insulating layer 40 through the contact hole CH-P, but the second auxiliary signal line PL-D2 may not be exposed from the fourth insulating layer 40. In the bonding area BDA, one pad area may be defined in a top surface of the first display substrate 100, and another pad area may be defined in the bottom surface of the first display substrate 100.

Figure 5:
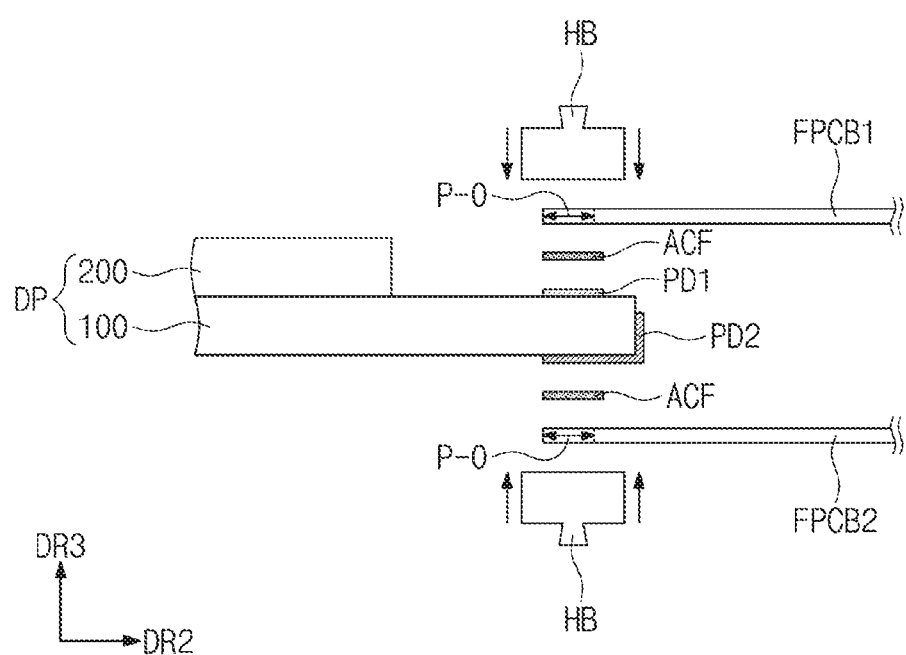
FIG. 5 is a cross-sectional view illustrating a method of manufacturing a display device according to an exemplary embodiment of the inventive concepts.

FIG. 5 is a cross-sectional view illustrating a method of manufacturing a display device DD according to an exemplary embodiment of the inventive concepts.

The display panel DP including the first pads PD1 and the second pads PD2 may be provided. In addition, the anisotropic conductive films ACF and the first and second connection circuit boards FPCB1 and FPCB2 may be provided. One of the anisotropic conductive films ACF may be disposed between the first connection circuit board FPCB1 and the first pads PD1, and the other of the anisotropic conductive films ACF may be disposed between the second connection circuit board FPCB2 and the second pads PD2.

The one anisotropic conductive film ACF may be preliminarily bonded to the first pads PD1 or the first connection circuit board FPCB1. The other anisotropic conductive film ACF may be preliminarily bonded to the second pads PD2 or the second connection circuit board FPCB2.

The first connection circuit board FPCB1 and/or the second connection circuit board FPCB2 may be pressed by a heating block HB. Two heating blocks HB disposed over and under the display panel DP are illustrated as an example in FIG. 5. The heating block HB may be a pressing member capable of generating heat and is not limited to a specific kind. The heat-pressed anisotropic conductive film ACF may electrically connect the first pads PD1 to the output pads P-O.

Figure 6A:
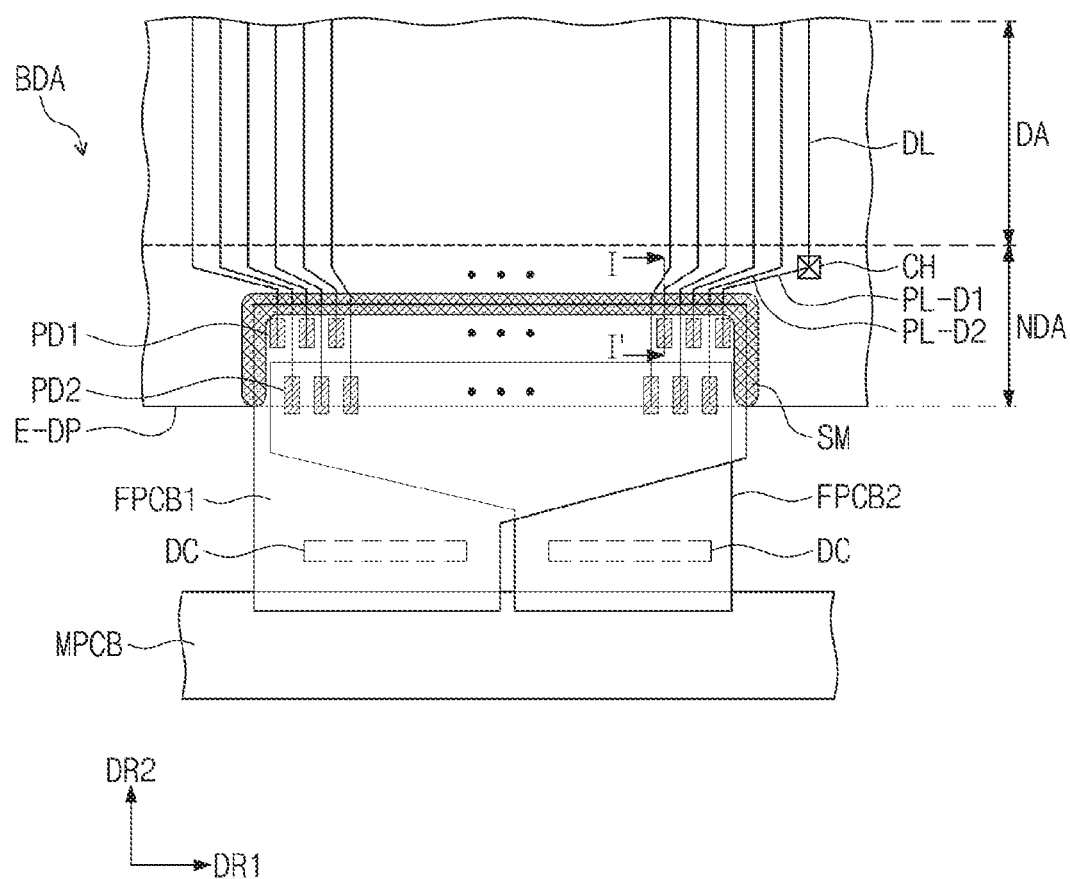
FIG. 6A is an enlarged plan view illustrating a display device according to an exemplary embodiment of the inventive concepts.
Figure 6B:
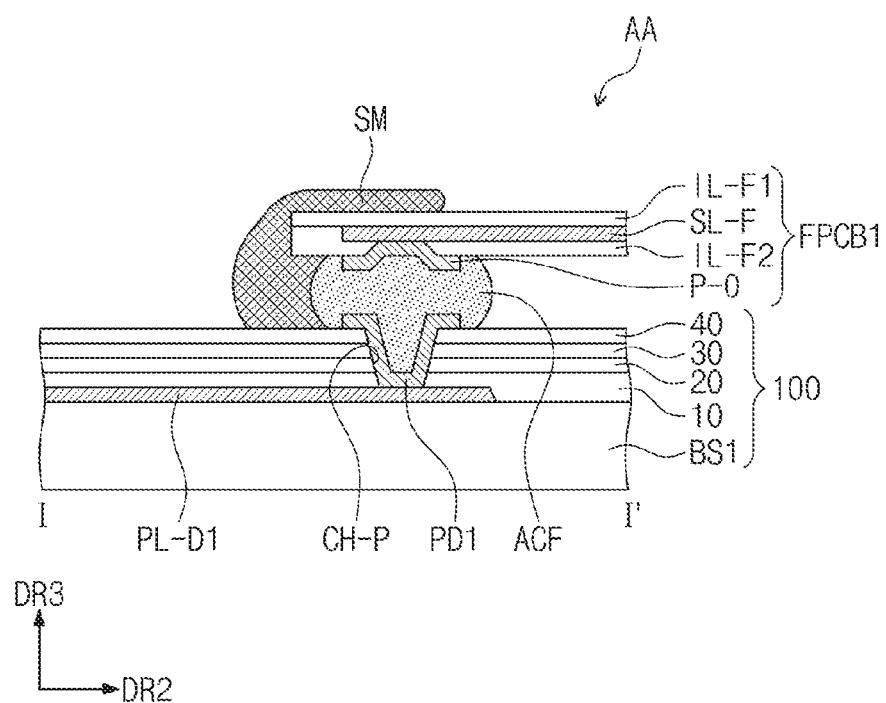
FIG. 6B is a cross-sectional view illustrating a display device according to an exemplary embodiment of the inventive concepts.

FIG. 6A is an enlarged plan view illustrating a display device DD according to an exemplary embodiment of the inventive concepts. FIG. 6B is a cross-sectional view illustrating a display device DD according to an exemplary embodiment of the inventive concepts.

As illustrated in FIGS. 6A and 6B, the display device may further include a sealing member SM that seals a gap between the first connection circuit board FPCB1 and the insulating layer (e.g., the fourth insulating layer 40 of FIG. 6B). The sealing member SM may overlap with a portion of the edge of the first connection circuit board FPCB1, which overlaps with the first display substrate 100.

The sealing member SM may include a synthetic resin. For example, the sealing member SM may include a silicon resin having a high resistance to water or moisture. A liquid synthetic resin may be provided to the portion of the edge of the first connection circuit board FPCB1, and thus the liquid synthetic resin may move into the gap between the first connection circuit board FPCB1 and the insulating layer by a capillary phenomenon. The liquid synthetic resin may be hardened to form the sealing member SM.

The display device may further include a sealing member sealing a gap between the second connection circuit board FPCB2 and the bottom surface of the first base layer BS1.

According to the exemplary embodiments of the inventive concepts, the first pad and the second pad may be disposed on different surfaces, and thus a planar area or size of the bonding area may be reduced. As a result, a slim bezel area may be provided.

Since the first pad and the second pad are bonded to the first connection circuit board and the second connection circuit board on different surfaces of the display substrate, respectively, interference between the first and second connection circuit boards may be reduced or minimized. Since the first and second connection circuit boards are not directly stacked, the physical interference between the first and second connection circuit boards may be reduced or minimized. Thus, bonding strength between the connection circuit board and the pad may be increased, and a gap between the connection circuit board and the pad may be reduced.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
   a display substrate including a base layer, an insulating layer disposed on the base layer, a first signal line disposed on the base layer, a second signal line disposed on the base layer, a first pad exposed from the insulating layer and connected to the first signal line, and a second pad disposed on a side surface and a bottom surface of the base layer, wherein a side surface of the second signal line is entirely above the base layer and is connected to the second pad on the side surface of the base layer;
   a main circuit board;
   a first connection circuit board electrically connecting the first pad and the main circuit board; and
   a second connection circuit board electrically connecting the second pad and the main circuit board,
   wherein the first pad and the second pad are disposed along a same side of the display substrate,
   wherein a side opposite to a side surface of the second pad connected to the side surface of the second signal line is exposed outside, and the second connection circuit board is connected to the second pad on the bottom surface of the base layer.

2. The display device of claim 1, wherein the side surface of the second signal line is substantially aligned with the side surface of the base layer.

3. The display device of claim 1, wherein the side surface of the second signal line is substantially aligned with a side surface of the insulating layer.

4. The display device of claim 1, wherein the first pad is connected to the first signal line through a contact hole penetrating the insulating layer.

5. The display device of claim 1, wherein the first pad is spaced apart from an edge of the insulating layer.

6. The display device of claim 1, wherein the first signal line and the second signal line are disposed on a same layer.

7. The display device of claim 1, wherein the second pad comprises metal paste.

8. The display device of claim 7, wherein the first pad comprises silver (Ag), copper (Cu), gold (Au), or aluminum (Al).

9. The display device of claim 1, wherein the first connection circuit board and the second connection circuit board are bonded to a same surface of the main circuit board.

10. The display device of claim 1, further comprising:
    a driving chip mounted on each of the first and second connection circuit boards.

11. The display device of claim 10, wherein a width of a portion of the first connection circuit board is less than a width of another portion of the first connection circuit board, the portion of the first connection circuit board overlaps with the driving chip, and the another portion of the first connection circuit board overlaps with the first pad.

12. The display device of claim 1, wherein the first connection circuit board and the second connection circuit board partially overlap with each other.

13. The display device of claim 1, wherein the first connection circuit board overlaps with the first pad and the second pad.

14. The display device of claim 1, further comprising:
    an anisotropic conductive film bonding the first pad to the first connection circuit board.

15. The display device of claim 1, further comprising:
    a sealing member sealing a gap between the first connection circuit board and the insulating layer.

16. A display device comprising:
    a display substrate including a base layer, an insulating layer disposed on the base layer, a plurality of first signal lines disposed on the base layer, a plurality of second signal lines disposed on the base layer, a plurality of first pads connected to the plurality of first signal lines, respectively, and a plurality of second pads disposed on a side surface and a bottom surface of the base layer, wherein side surfaces of the plurality of second signal lines are entirely above the base layer and are connected to the plurality of second pads on the side surface of the base layer, respectively;
    a main circuit board;
    a first connection circuit board electrically connecting the plurality of first pads to the main circuit board; and
    a second connection circuit board electrically connecting the plurality of second pads to the main circuit board,
    wherein the plurality of first pads and the plurality of second pads are disposed along a same side of the display substrate,
    wherein a side opposite to each of side surfaces of the plurality of second pads connected to the side surfaces of the plurality of second signal lines is exposed outside, and the second connection circuit board is connected to the plurality of second pads on the bottom surface of the base layer.

17. The display device of claim 16, wherein the first signal lines and the second signal lines are alternately arranged.

18. The display device of claim 16, wherein each of the plurality of first signal lines is partially exposed from the insulating layer in an area overlapping with a corresponding one of the plurality of first pads, in an area where the insulating layer overlaps with the first connection circuit board, and
> wherein the plurality of second signal lines is not exposed from the insulating layer in the area where the insulating layer overlaps with the first connection circuit board.

* * * * *